United States Patent
McLeod et al.

(10) Patent No.: US 8,659,973 B2
(45) Date of Patent: Feb. 25, 2014

(54) SEQUENTIAL-WRITE, RANDOM-READ MEMORY

(75) Inventors: Scott McLeod, Los Gatos, CA (US); William W. Walker, Los Gatos, CA (US)

(73) Assignee: Fujitsu Limited, Kawasaki-shi (JP)

(*) Notice: Subject to any disclaimer, the term of this patent is extended or adjusted under 35 U.S.C. 154(b) by 231 days.

(21) Appl. No.: 12/819,082

(22) Filed: Jun. 18, 2010

(65) Prior Publication Data

US 2011/0310692 A1  Dec. 22, 2011

(51) Int. Cl.
 G11C 8/00 (2006.01)
 G11C 8/04 (2006.01)
 G11C 7/22 (2006.01)

(52) U.S. Cl.
 CPC . *G11C 8/04* (2013.01); *G11C 7/222* (2013.01)
 USPC ............... 365/239; 365/189.15; 365/230.09; 365/233.11; 365/233.1; 365/193

(58) Field of Classification Search
 USPC ............ 365/239, 233.1, 233.11, 236
 See application file for complete search history.

(56) References Cited

U.S. PATENT DOCUMENTS

| | | | |
|---|---|---|---|
| 5,535,170 A | 7/1996 | Imamura | |
| 5,612,926 A | 3/1997 | Yazawa | |
| 5,699,087 A | 12/1997 | Krenik | |
| 5,848,015 A | 12/1998 | Seno | |
| 5,956,748 A * | 9/1999 | New | 711/149 |
| 6,047,339 A * | 4/2000 | Su et al. | 710/56 |
| 6,191,992 B1 * | 2/2001 | Komoto | 365/221 |
| 6,327,207 B1 * | 12/2001 | Sluiter et al. | 365/221 |
| 6,470,439 B2 * | 10/2002 | Yamada et al. | 711/215 |
| 7,310,260 B2 * | 12/2007 | Van Dyke et al. | 365/78 |
| 7,477,570 B2 | 1/2009 | Warner | |
| 8,254,201 B2 * | 8/2012 | Sohn et al. | 365/233.1 |
| 2004/0047209 A1 * | 3/2004 | Lien et al. | 365/202 |
| 2009/0061795 A1 | 3/2009 | Doan | |

* cited by examiner

*Primary Examiner* — Kretelia Graham
(74) *Attorney, Agent, or Firm* — Baker Botts L.L.P.

(57) ABSTRACT

In one embodiment, a method includes, in response to assertion of a write-enable signal at a memory array that comprises a plurality of words, sequentially and at a first clock frequency writing data to the memory array starting at a beginning of the memory array until the memory array is full. The method includes, independent of the writing of data to the memory array, asynchronously and at a second clock frequency that is slower than the first clock frequency reading data from the memory array based on read addresses received at the memory array.

18 Claims, 7 Drawing Sheets

SEQUENTIAL-WRITE, RANDOM-READ MEMORY

TECHNICAL FIELD

This disclosure relates generally to memory devices.

BACKGROUND

Sequential-access memory (SAM) devices access their data in a predetermined, ordered sequence. In contrast, random-access memory (RAM) devices can access their data in any order.

DESCRIPTION OF EXAMPLE EMBODIMENTS

SAM devices access their data in a predetermined, ordered sequence. In contrast, RAM devices can access their data in any order. The following, which are all incorporated herein by reference as an example and not by way of limitation, disclose example memory devices: U.S. Pat. No. 5,535,170, entitled Sequential Memory Access that Can Have Circuit Area Reduced; U.S. Pat. No. 5,612,926, entitled Sequential Access Memory; U.S. Pat. No. 5,699,087, entitled Sequential Access Memories, Systems and Methods; U.S. Pat. No. 5,848,015, entitled Bitline Precharge Halt Access Mode for Low Power Operation of a Memory Device; U.S. Pat. No. 7,477,570, entitled Sequential Access Memory with System and Method. U.S. Patent Application Publication No. 2009/0061795, entitled Wireless Architecture for 60 GHz, which is also incorporated herein by reference as an example and not by way of limitation, discloses an example system for wireless communication at millimeter-wave (mm-wave) frequencies around 60 GHz.

Figure 1:
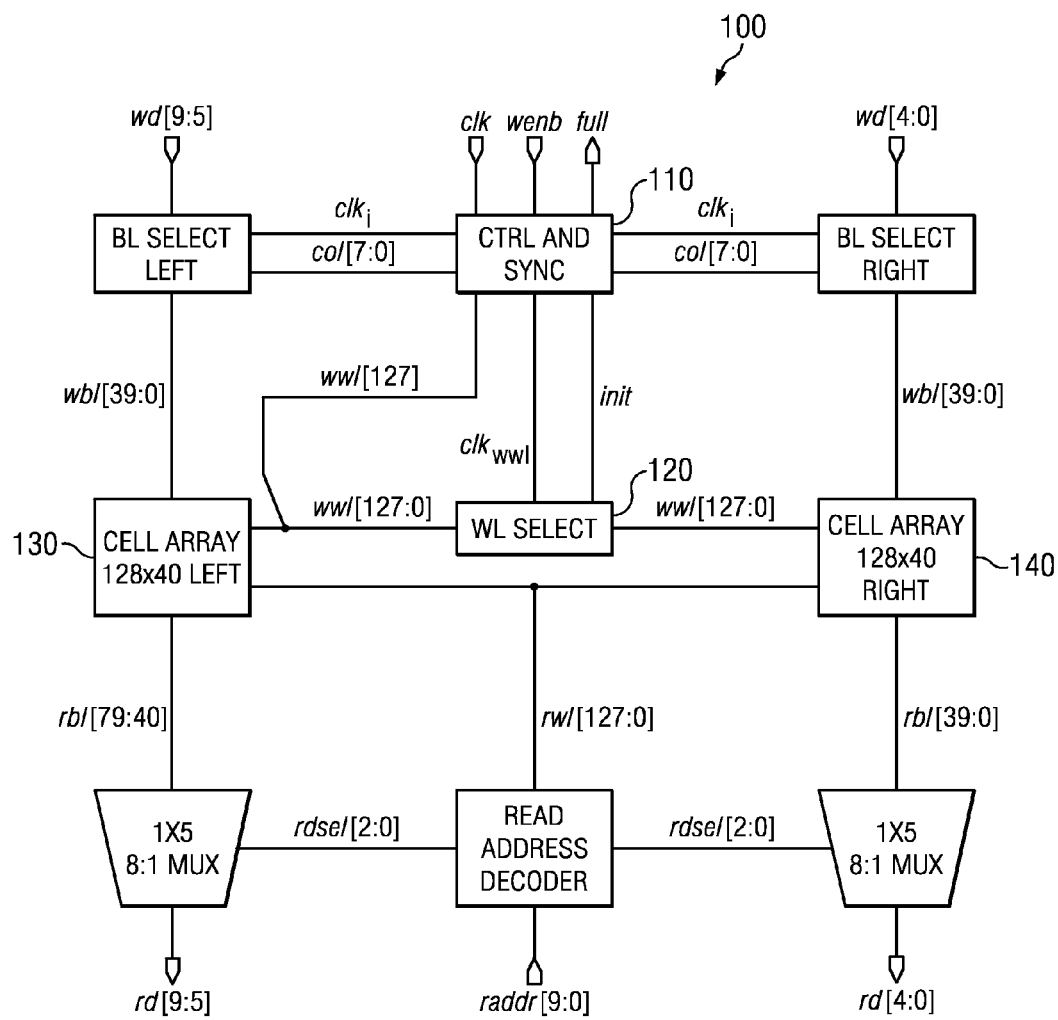
FIG. 1 illustrates an example memory array.

Particular embodiments provide a hybrid SAM-RAM device, which combines sequential memory-write access with random memory-read access. In particular embodiments, the memory write and memory read are two independent operations and may be performed independently from each other. In particular embodiments, the sequential memory-write access may be performed at a relatively high speed, while the random memory-read access may be performed at a relatively low speed. FIG. 1 illustrates the overview of an example memory array 100 suitable for implementing a hybrid SAM-RAM device.

In particular embodiments, memory array 100 is a 1024-word by 10-bit array. In particular embodiments, memory array 100 is a 1024-word by 10-bit 1-write 1-read register file. Such memory array may be used in various applications. For example, memory array 100 may be used in conjunction with Joint Test Action Group (JTAG) Test Access Port (TAP) circuit or other types of circuit to capture and store the outputs of an analog-to-digital converter (ADC) or other types of circuit. As another example, memory array 100 may be used in a WPAN radio module. In such an application, a relatively large quantity (e.g., 1 kB) of digitized data can be sequentially captured and stored in memory array 100 until being accessed by digital baseband circuitry, such as a digital signal processor (DSP).

In FIG. 1, the port symbols represent primary signal I/O and the 2.5-GHz baseband clock is labeled clk. The following nets in FIG. 1 are digital data input signals or digital control input signals received from an external circuit, such as, for example, an ADC or JTAG TAP circuit:

| Name | Type | Description |
| --- | --- | --- |
| raddr[9:0] | ctrl | Read address, asynchronous |
| wd[14:0] | data | Write data |
| wenb | ctrl | Write enable signal |

The following nets in FIG. 1 are digital observation bits to an external circuit:

| Name | Type | Description |
| --- | --- | --- |
| full | ctrl | Full output signal |
| rd[9:0] | data | Output data |

In particular embodiments, the IQ baseband signal is sampled and digitized by the ADCs at a baseband clock frequency of 2.5 GHz. The output of the ADC is written to memory array 100 for reading and processing by, for example, a DSP. As an example and not by way of limitation, the DSP may implement baseband training algorithms that could, for example, correct impairments (such as DC offset, phase noise, non-linearities, and IQ mismatch) that may be present in the transmitter, channel, or receiver.

In particular embodiments, at the baseband clock frequency the ADC samples and digitizes the baseband signal produced by the mm-wave front end circuits of a radio receiver. In particular embodiments, following assertion of wenb, 1024 contiguous ADC output samples are captured in the 1024×10-bit memory array. The memory array asserts its full output pin after sample 1024 has been captured. Then it can be read out, for example, through a JTAG TAP circuit into software-based baseband algorithms programmed in MATLAB. The following describes (as an example only and not by way of limitation) the operation of the memory array in particular embodiments:

The rising edge of wenb resets the write address pointer to the first word (after 2 clock cycles). Two cycles later, the register file's internal clock, $clk_i$, is enabled. Each 10-bit word is then written contiguously from address 0 to address 1023 at the rising edge of $clk_i$. wenb must remain high for the duration of write operations.

On $clk_i$ rising edge 1024, no data is written into the array. Instead, output full is asserted and the memory array performs no more write operations until a rising edge of wenb is detected.

Read is asynchronous and performed through the control circuit (e.g., JTAG TAP). The read data, rd[9:0], outputs the data stored in the memory cell addressed by raddr[9:0].

Figure 2:
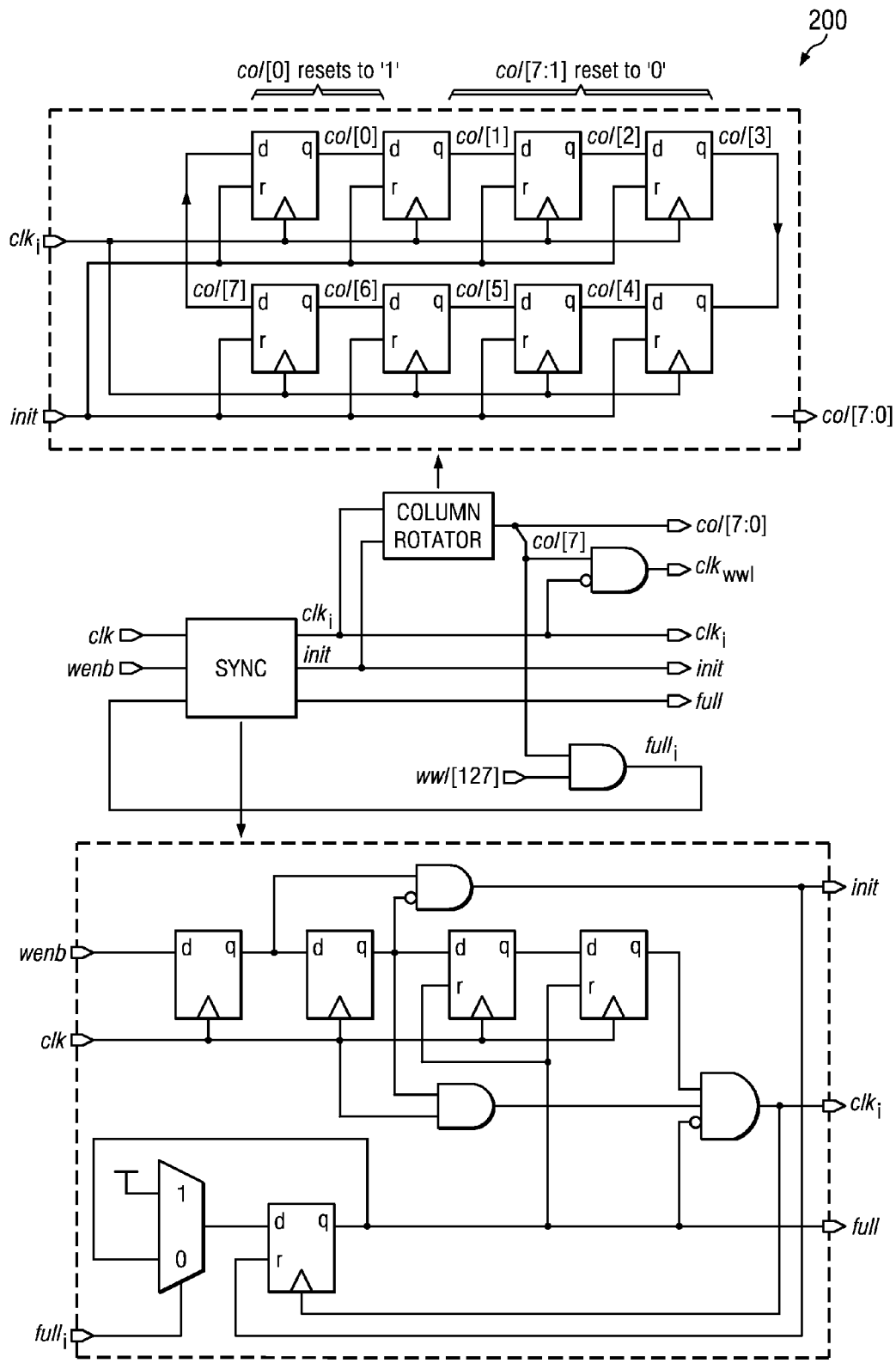
FIG. 2 illustrates an example control and synchronization circuit.

In particular embodiments, memory array 100 illustrated in FIG. 1 may include a control and synchronization component 110. FIG. 2 illustrates an example control and synchronization circuit 200, which may be used as a suitable implementation for control and synchronization component 110 of memory array 100.

Figure 3:
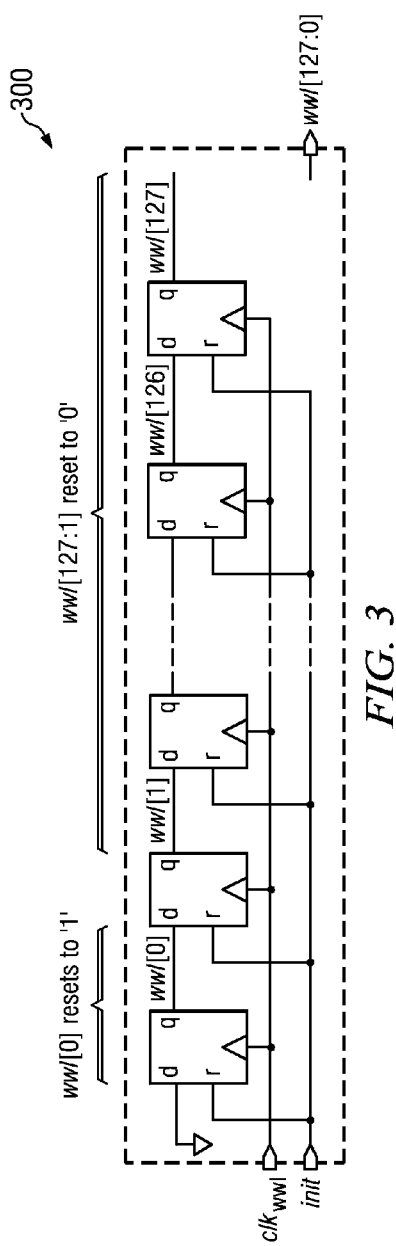
FIG. 3 illustrates an example write word-line (WL) select circuit.

In particular embodiments, memory array 100 illustrated in FIG. 1 may include word line (WL)-select component 120. FIG. 3 illustrates an example Write-WL select circuit 300, which may be used as a suitable implementation for WL select component 120 of memory array 100.

Figure 4:
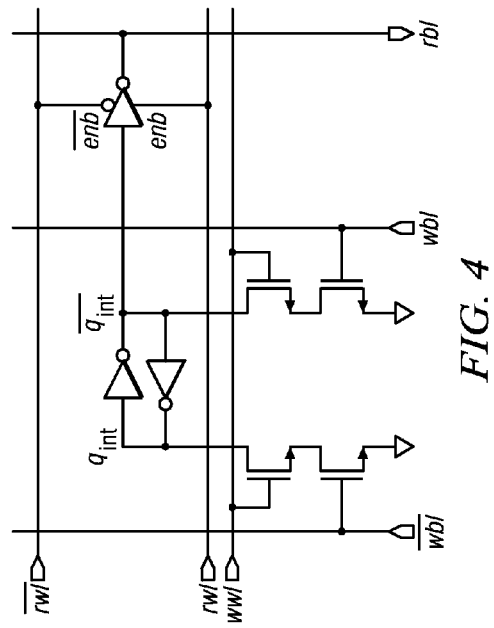
FIG. 4 illustrates an example memory cell schematic.
Figure 5:
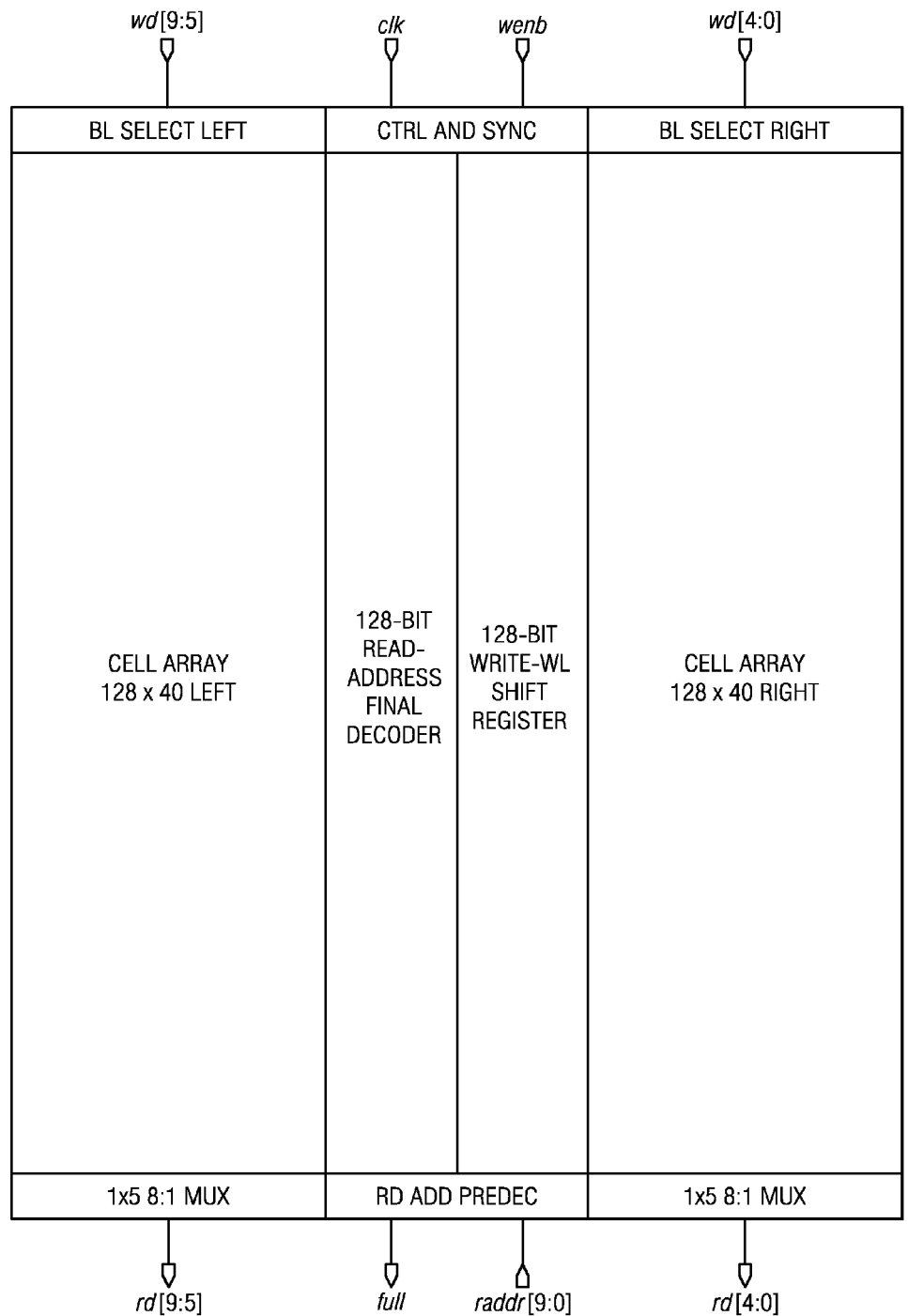
FIG. 5 illustrates an example floor plan of an example memory array.
Figure 6:
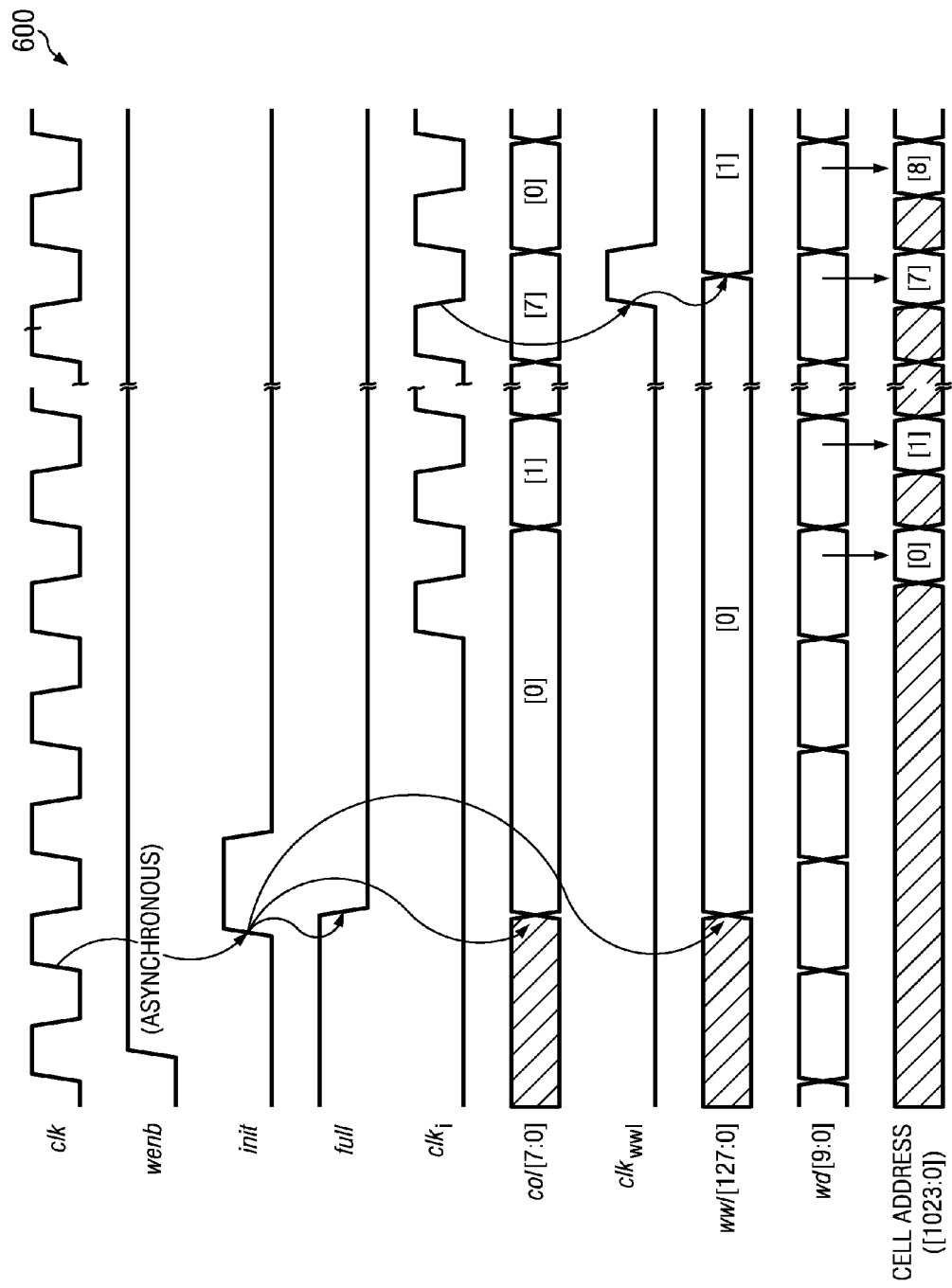
FIG. 6 illustrates an example timing diagram of an example memory array, which illustrates the start of a write sequence.
Figure 7:
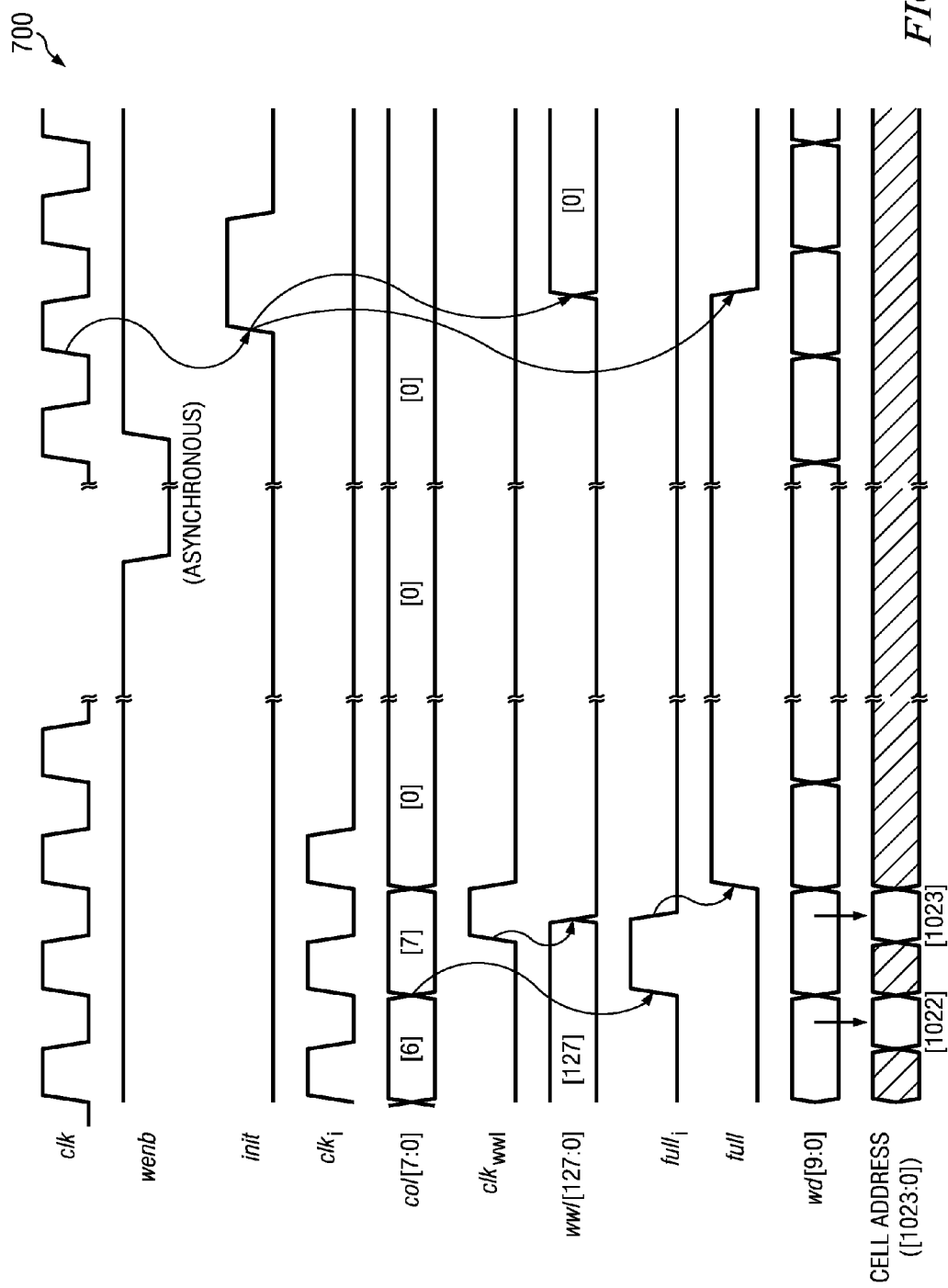
FIG. 7 illustrates an example timing diagram of an example memory array, which illustrates the completion of one write sequence and the start of another write sequence.

In particular embodiments, memory array 100 illustrated in FIG. 1 may include a left cell array 130 and a right cell array 140. FIG. 4 illustrates an example memory cell schematic. In particular embodiments, memory cells, such as the one illustrated in FIG. 4, may be incorporated in memory array 100 to form left cell array 130 and right cell array 140. FIG. 5 illustrates an example floor plan of memory array 100 illustrated in FIG. 1. FIG. 6 illustrates an example timing diagram 600 of memory 100 illustrated in FIG. 1, which illustrates the start of a write sequence. Although cell addresses are shown in timing diagram 600 as incrementing from 0 to 1023, particular embodiments may use an 8-bit rotator to route each wd[9:0] bit to one of eight columns and a 128-bit shifter to increment through the 128 write word lines (WWL). The shifter increments the WWL every eight clock cycles. Each WWL thus remains high as the rotator increments the column from 0 to 7.

In particular embodiments, memory array 100 illustrated in FIG. 1 may include a control and synchronization component 110. Control and synchronization component 110 may receive input signals clk and wenb from an external circuit. Control and synchronization component 110 may transmit output signal full to an external circuit. In particular embodiments, memory array 100 illustrated in FIG. 1 may include word line (WL)-select component 120. In particular embodiments, memory array 100 illustrated in FIG. 1 may include a left cell array 130 and a right cell array 140. In particular embodiments, memory array 100 illustrated in FIG. 1 may include a left bit-line (BL) select component and a right BL select component. Left and right BL select components may receive write data wd. In particular embodiments, memory array 100 illustrated in FIG. 1 may include a read address decoder component. The read address decoder may receive read address raddr from an external circuit. In particular embodiments, memory array 100 illustrated in FIG. 1 may include a 1×5 8:1 MUX component for left cell array 130, and a 1×5 8:1 MUX component for right cell array 140. 1×5 8:1 MUX components may transmit output data rd to an external circuit. Memory array 100 illustrated in FIG. 1 may include internal clock $clk_i$ and signals col[7:0] connecting control and synchronization component 110 and the left BL select component. Memory array 100 illustrated in FIG. 1 may include internal clock clk, and signals col[7:0] connecting control and synchronization component 110 and the right BL select component. Memory array 100 illustrated in FIG. 1 may include signals rdsel[2:0] connecting the read address decoder to the 1×5 8:1 MUX components at the left and at the right, respectively. Memory array 100 illustrated in FIG. 1 may include signals rwl[127:0] connecting the read address decoder to left cell array 130 and right cell array 140. Memory array 100 illustrated in FIG. 1 may include read bit-line signals rbl[79:40] connecting left cell array 130 and the 1×5 8:1 MUX at the left. Memory array 100 illustrated in FIG. 1 may include read bit-line signals rbl[39:0] connecting right cell array 140 and the 1×5 8:1 MUX at the right. Memory array 100 illustrated in FIG. 1 may include write bit-line signals wbl[39:0] connecting the left BL select component and left cell array 130. Memory array 100 illustrated in FIG. 1 may include write bit-line signals wbl[39:0] connecting the right BL select component and right cell array 140. Memory array 100 illustrated in FIG. 1 may include write word-line signals wwl[127:0] connecting WL select component 120 and left cell array 130. Memory array 100 illustrated in FIG. 1 may include write word-line signals wwl[127:0] connecting WL select component 120 and right cell array 140. Memory array 100 illustrated in FIG. 1 may include init signal, $clk_{wwl}$ signal, and write word-line signal wwl[127] connecting control and synchronization component 110 and WL select component 120. FIG. 2 illustrates an example control and synchronization circuit 200, which may be used as a suitable implementation for control and synchronization component 110 of memory array 100. The example control and synchronization circuit 200 may include an internal signal $full_i$. The example control and synchronization circuit 200 may include a sync component, which example embodiment is illustrated at the bottom of FIG. 2. The example control and synchronization circuit 200 may include a column rotator component, which example embodiment is illustrated at the top of FIG. 2.

FIG. 3 illustrates an example Write-WL select circuit 300, which may be used as a suitable implementation for WL select component 120 of memory array 100.

FIG. 4 illustrates an example memory cell schematic. In particular embodiments, memory cells, such as the one illustrated in FIG. 4, may be incorporated in memory array 100 to form left cell array 130 and right cell array 140. The memory cell illustrated in FIG. 4 may receive an /rwl signal, rwl signal, wwl signal, /wbl signal, and wbl signal and output an rbl signal. The memory cell illustrated in FIG. 4 may process $q_{int}/q_{int}$, /enb, and enb signals. FIG. 5 illustrates an example floor plan of memory array 100 illustrated in FIG. 1. The floor plan of memory array 100 illustrated in FIG. 5 includes a BL Select Left, BL Select Right, Control and Sync, a left cell array, a right cell array, an 128-bit read-address final decoder, an 128-bit write-WLshift register, an 1×5 8:1 MUX, a RD Add Predec, and an 1×5 8:1 MUX. FIG. 6 illustrates an example timing diagram 600 of memory 100 illustrated in FIG. 1, which illustrates the start of a write sequence. Although cell addresses are shown in timing diagram 600 as incrementing from 0 to 1023, particular embodiments may use an 8-bit rotator to route each wd[9:0] bit to one of eight columns and a 128-bit shifter to increment through the 128 write word lines (WWL). The shifter increments the WWL every eight clock cycles. Each WWL thus remains high as the rotator increments the column from 0 to 7.

Figure 9:
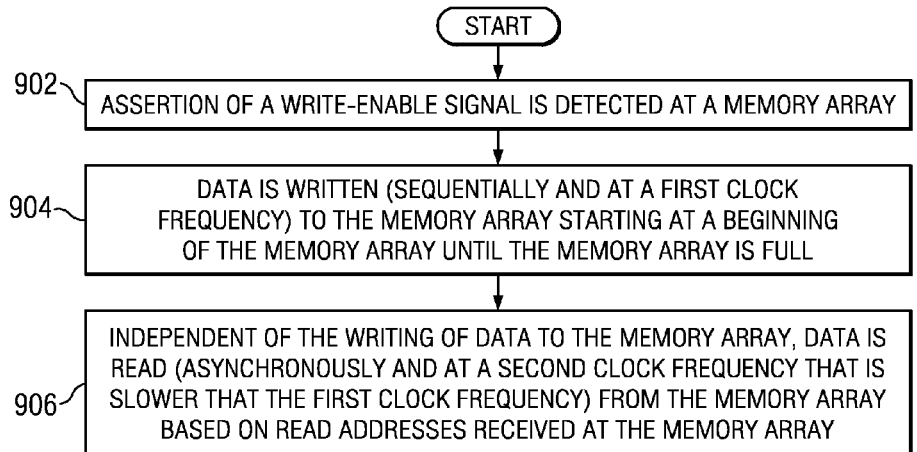
FIG. 9 illustrates an example method for sequential-write random-read memory.

Although this disclosure describes and illustrates particular steps of the method of FIG. 9 as occurring in a particular order, this disclosure contemplates any suitable steps of the method of FIG. 9 occurring in any suitable order. Moreover, although this disclosure describes and illustrates particular components carrying out particular steps of the method of FIG. 9, this disclosure contemplates any suitable components carrying out any suitable steps of the method of FIG. 9.

Figure 8:
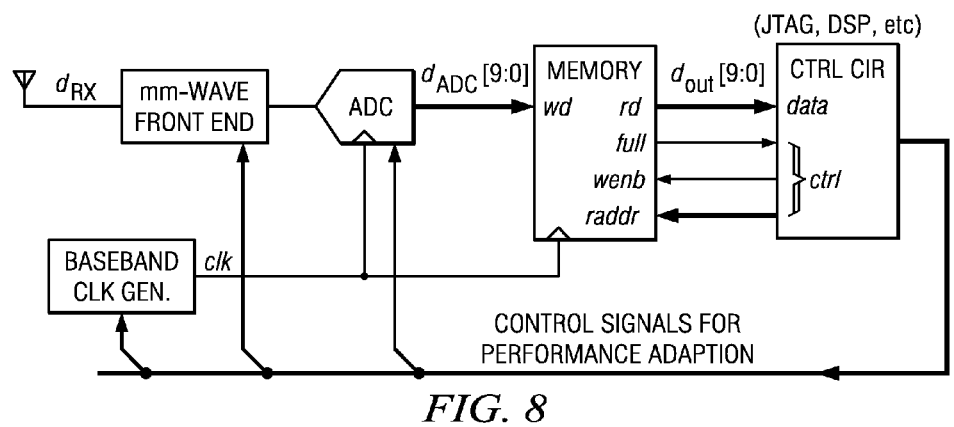
FIG. 8 illustrates an example radio frequency (RF) receiver with an example memory array.

FIG. 8 illustrates an example RF receiver with an example memory array, such as memory array 100 illustrated in FIG. 1. In particular embodiments, the receiver block includes a mm-wave front end (e.g., receiving signal $d_{RX}$ from an antenna as illustrated in FIG. 8), a baseband clock generator (e.g., generating clock signal clk as illustrated in FIG. 8), one or more analog-to-digital converters (ADCs), and a memory array to capture and store the outputs of the ADC(s), and a control circuit ("Ctrl Cir," e.g., JTAG, DSP) that controls the memory array. The output of the ADC(s) (e.g., $d_{ADC}[9:0]$ illustrated in FIG. 8) is stored in the memory array and may be read in chunks of 1024 words for post-processing. For example, the control circuit may read data $d_{out}[9:0]$ from the memory array using full, wenb, and raddr signals, as illustrated in FIG. 8. The control circuit may also generate signals, based on the data captured and stored in the memory array, that control or adapt the circuits that make up the radio receiver and affect its performance. Such settings may include gain control, attenuation control, and phase correction, among others.

In particular embodiments, power consumption and chip area are reduced by the absence of sense amplifiers. Because the read operations are performed at a slower clock frequency than write operations, sense amplifiers are not required to resolve the logical value of the voltage issued onto an accessed read bit-line (RBL) within one cycle of the baseband clock. In particular embodiments, power consumption may be reduced by smaller pre-charge circuitry. Conventionally, a memory array's write bit-lines (WBLs) and RBLs are pre-charged to a known voltage level prior to a write or read operation. This may be performed by a pre-charge signal that is activated every clock cycle or at a reduced rate. In contrast, in particular embodiments, no pre-charge is required for read operations, because the baseband circuit (which may be a DSP) operates at a clock frequency much slower than the system clock. As a result, the RBLs need not be pre-charged, saving power and area.

For write operations, particular embodiments take advantage of the nature of the memory device's sequential access. When write operations are performed, a particular column of storage cells in the memory array will be accessed only once per row of storage cells (every eight clock cycles in particular embodiments). This leaves a number of clock cycles (seven in particular embodiments) for the WBL of that column to return to a known state prior to the start of the next write operation on that column—i.e., when writing into the next row. Because the voltages of the WBLs have seven clock cycles by which to settle, the pre-charge circuitry can be smaller, and thus consume less power, than it would if the WBLs were pre-charged every clock cycle. In particular embodiments, read and write operations are independent of each other (random and sequential, respectively), which may allow read operations to commence before write operations complete, according to particular needs.

Herein, reference to a memory array or memory device encompasses one or more tangible computer-readable storage media possessing structure. As an example and not by way of limitation, a memory array or memory device may include or be a part of a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a memory array or memory device excludes any medium that is not eligible for patent protection under 35 U.S.C. §101. Herein, reference to a memory array or memory device excludes transitory forms of signal transmission (such as a propagating electrical or electromagnetic signal per se) to the extent that they are not eligible for patent protection under 35 U.S.C. §101.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. A method comprising:
   in response to assertion of a write-enable signal received at a memory device comprising a memory array, writing data, at a first clock frequency, to the memory array sequentially starting at a beginning of the memory array until the memory array is full; and
   asynchronous and independent of the writing data to the memory array, reading data, at a second clock frequency that is slower than the first clock frequency, from the memory array, the reading of the data from the memory array being initiated after the memory array is full, the data being read from the memory array randomly and based on read addresses received at the memory device.

2. The method of claim 1, wherein the memory device is an n-word by m-bit 1-write 1-read register file, Wherein n and m are integers.

3. The method of claim 1, wherein:
   the memory array comprises a plurality of contiguous words; and
   the writing data, at the first clock frequency, to the memory array sequentially starting at a beginning of the memory array further comprises writing data to the words of the memory array in order from a first one of the words to a last one of the words.

4. The method of claim 1, wherein the write-enable signal comprises at least a control bit to the memory device.

5. The method of claim 1, wherein the read addresses comprise control bits to the memory device.

6. The method of claim 1, wherein the writing data, at the first clock frequency, to the memory array further comprises writing contiguous data produced by an external circuit to the memory device at the first clock frequency.

7. The method of claim 1, wherein the reading data starts before the writing data completes.

8. The method of claim 1, further comprising disabling an internal clock of the memory device when the memory array is full and asserting an output signal indicating that the memory array is full until reassertion of the write-enable signal.

9. The method of claim 8, wherein disabling the internal clock at least in part causes the memory device to consume substantially zero power.

10. A memory device configured to:
    in response to assertion of a write-enable signal received at the memory device comprising a memory array, write data, at a first clock frequency, to the memory array sequentially starting at a beginning of the memory array until the memory array is full; and
    asynchronous and independent of the writing data to the memory array, read data, at a second clock frequency that is slower than the first clock frequency, from the memory array, the reading of the data from the memory array being initiated after the memory array is full, the data being read from the memory array randomly and based on read addresses received at the memory device.

11. The memory device of claim 10, wherein the memory device is an n-word by m-bit 1-write 1-read register file, wherein n and m are integers.

12. The memory device of claim 10, wherein:
the memory array comprises a plurality of contiguous words; and
the writing data, at the first dock frequency, to the memory array sequentially starting at a beginning of the memory array further comprises writing data to the words of the memory array in order from a first one of the words to a last one of the words.

13. The memory device of claim 10, wherein the write-enable signal comprises at least a control bit to the memory device.

14. The memory device of claim 10, wherein the read addresses comprise control bits to the memory device.

15. The memory device of claim 10, wherein the writing data, at the first clock frequency, to the memory array further comprises writing contiguous data produced by an external circuit to the memory device at the first clock frequency.

16. The memory device of claim 10, wherein the reading data starts before the writing data completes.

17. The memory device of claim 10, further configured to disable an internal clock of the memory device when the memory array is full and assert an output signal indicating that the memory array is full until reassertion of the write-enable signal.

18. The memory device of claim 17, wherein disabling the internal clock at least in part causes the memory device to consume substantially zero power.

\* \* \* \* \*

UNITED STATES PATENT AND TRADEMARK OFFICE
CERTIFICATE OF CORRECTION

PATENT NO. : 8,659,973 B2  Page 1 of 1
APPLICATION NO. : 12/819082
DATED : February 25, 2014
INVENTOR(S) : Scott McLeod et al.

It is certified that error appears in the above-identified patent and that said Letters Patent is hereby corrected as shown below:

In the Claims

Claim 12, Col. 7, Ln. 7: After "first" and before "frequency" delete "dock" and insert --clock--.

Signed and Sealed this
Seventh Day of October, 2014

Michelle K. Lee
*Deputy Director of the United States Patent and Trademark Office*